US012777595B2

(12) United States Patent
Eum et al.

(10) Patent No.: US 12,777,595 B2
(45) Date of Patent: Oct. 27, 2026

(54) DISPLAY APPARATUS

(71) Applicant: LG Display Co., Ltd., Seoul (KR)

(72) Inventors: Hyo-Sup Eum, Seoul (KR); Heedong Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 168 days.

(21) Appl. No.: 18/765,023

(22) Filed: Jul. 5, 2024

(65) Prior Publication Data

US 2025/0275068 A1 Aug. 28, 2025

(30) Foreign Application Priority Data

Feb. 26, 2024 (KR) ........................ 10-2024-0027013

(51) Int. Cl.
*H05K 5/02* (2006.01)

(52) U.S. Cl.
CPC .................................. *H05K 5/0217* (2013.01)

(58) Field of Classification Search
CPC ............ H05K 5/0217; G02F 1/133334; G02F 1/133308; G06F 1/1656
See application file for complete search history.

(56) References Cited

U.S. PATENT DOCUMENTS 10,798,849 B2 * 10/2020 Lee ....................... G06F 1/1658
11,013,150 B2 * 5/2021 Kim ....................... H05K 7/205
2008/0212270 A1 * 9/2008 Choi .................... H05K 9/0054 361/752
2015/0264842 A1 * 9/2015 Song .................. H05K 7/20445 29/840
2019/0364695 A1 * 11/2019 Lee ....................... G06F 1/1658
2020/0178415 A1 * 6/2020 Kim ................... H05K 7/20454
2021/0161039 A1 * 5/2021 Jung .................... H05K 9/0081
2023/0171932 A1 * 6/2023 Yoon ..................... H04M 1/026 361/679.01

FOREIGN PATENT DOCUMENTS

KR 10-2007-0020718 A 2/2007
KR 10-0783169 B1 12/2007

* cited by examiner

*Primary Examiner* — Sagar Shrestha
(74) *Attorney, Agent, or Firm* — Birch, Stewart. Kolasch & Birch, LLP

(57) ABSTRACT

A display apparatus according to one example may include a display unit configured to display an image, a holder disposed above the display unit and provided in a plate shape, and a control assembly disposed above the holder and including a control board and a control chip mounted on an upper surface of the control board. The display apparatus may further include a separation member disposed between the holder and the control assembly to vertically separate the control assembly and the holder, a shield cover disposed to cover the control chip above the control assembly, and a coupling member for coupling the control board with the separation member. The separation member and the coupling member may be disposed at locations spaced apart from edges of the control board.

13 Claims, 6 Drawing Sheets

DISPLAY APPARATUS

CROSS-REFERENCE TO RELATED APPLICATION

The present application claims priority to Korean Patent Application No. 10-2024-0027013, filed Feb. 26, 2024, the entire contents of which is incorporated by reference into the present application.

BACKGROUND

Field

The present disclosure relates to a display apparatus, and more specifically, to a display apparatus having an effective heat dissipation structure.

Description of the Related Art

Contents described in this section simply provide background information on the present disclosure and do not constitute the related art.

In the full-fledged information age, the field of display apparatuses for visually displaying electrical information signals is developing rapidly. As such, research for developing performance, such as thinness, lightweight, and lower power consumption, for various display apparatuses is being continuously conducted.

Such display apparatuses include a liquid crystal display (LCD) device, a quantum dot (QD) display panel device, a field emission display (FED) device, and an electro-wetting display (EWD) device, an organic light emitting diode (OLED) display apparatus, etc.

The display apparatuses have been developed to be miniaturized so that users may carry the display apparatuses or to be mounted on movable devices such as vehicles, etc., and are being improved so that the users may use the display apparatuses more conveniently.

SUMMARY OF THE DISCLOSURE

A display apparatus may be provided with chips and elements that have high heat generation capacity, and a board including the chips and the elements therein. Heat may be generated in the display apparatus due to heating components, and the excessive heating may have a negative effect on the display apparatus.

With a current technological trend, the development of thin display apparatuses having an overall small thickness is accelerating for user convenience.

When excessive heat is generated due to the heating components in such a thin display apparatus, the heat generated from any one heating component may easily transfer to other components due to the close location to other components associated with the thin structure. This can cause overheating of the component receiving the heat, thereby degrading performance and in severe cases, causing a failure.

Therefore, it is necessary to smoothly transfer the heat generated from the heating component to the outside.

The display apparatus may have a structure in which a heat transfer member made of a material having high thermal conductivity is in contact with other components so that heat generated from the heating components is easily transferred to the external atmosphere to cool the display apparatus.

The heat conducted by the heat transfer member may be ultimately transferred to components disposed at the outermost portion of the display apparatus, and the outermost portion may serve as a heat sink to transfer heat to the atmosphere, thereby suppressing or addressing the overheating of the display apparatus.

Due to heating, the components constituting the display apparatus may be deformed by heat. Due to the thermal deformation of the components, the heat transfer member may be spaced apart from the heating component to prevent at least portion thereof from being in contact with the display apparatus, which may degrade the heat dissipation performance of the display apparatus.

Accordingly, various aspects of the present disclosure are directed to providing a display apparatus which can solve or address these limitations and issues associated with the related art.

As such, one or more aspects of the present disclosure are directed to providing a display apparatus including a structure capable of increasing heat dissipation performance by maintaining contact between a heat transfer member and a heating component even when thermal deformation due to heating occurs.

In addition, one or more aspects of the present disclosure are directed to providing a display apparatus having a structure capable of increasing the heat conduction effect by conduction by maintaining contact between a heat transfer member and another component.

Objects of the present disclosure are not limited to the above-described objects, and other objects and advantages of the present disclosure which are not mentioned can be understood by the following description and more clearly understood by embodiments of the present disclosure. In addition, it will be able to be easily seen that the objects and advantages of the present disclosure may be achieved by devices and combinations thereof that are described in the claims.

A display apparatus according to one embodiment of the present disclosure may include a display unit configured to display an image, a holder disposed above the display unit and provided in a plate shape, a control assembly disposed above the holder and including a control board and a control chip mounted on an upper surface of the control board, a separation member disposed between the holder and the control assembly to vertically separate the control assembly and the holder, a shield cover disposed to cover the control chip above the control assembly, and a coupling member for coupling the control board with the separation member, wherein the separation member and the coupling member may be disposed at locations spaced apart from edges of the control board.

According to one or more aspects of the present disclosure, the separation member and the coupling member may be disposed at locations spaced by a set distance inward from end portions of side surfaces of the control board.

According to one or more aspects of the present disclosure, when the control board is expanded and deformed due to heat, the control board may be provided to move down from the edge portions whose movement is not restricted by the separation member and the coupling member.

According to one or more aspects of the present disclosure, a plurality of separation members and coupling members may be provided, and the separation member and the coupling member may be disposed symmetrically with respect to the control chip.

The display apparatus according to one embodiment of the present disclosure may include a first pad disposed between the control chip and the shield cover and in contact with each of the control chip and the shield cover, a back cover disposed above the shield cover, and a second pad disposed between the shield cover and the back cover and in contact with each of the shield cover and the back cover.

The display apparatus according to one embodiment of the present disclosure may include a holding member having one side coupled to the shield cover and the other side coupled to the back cover to pull the shield cover and the back cover so that the second pad maintains contact between the shield cover and the back cover.

According to one or more aspects of the present disclosure, the coupling member may pull the control board and the shield cover so that the first pad maintains contact between the control chip and the shield cover, and the holding member may pull the shield cover and the back cover so that the second pad maintains the contact with each of the shield cover and the back cover.

These and other objects of the present application will become more readily apparent from the detailed description given hereinafter. However, it should be understood that the detailed description and specific examples, while indicating various embodiments of the invention, are given by way of illustration only, since various changes and modifications within the spirit and scope of the invention will become apparent to those skilled in the art from this detailed description.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
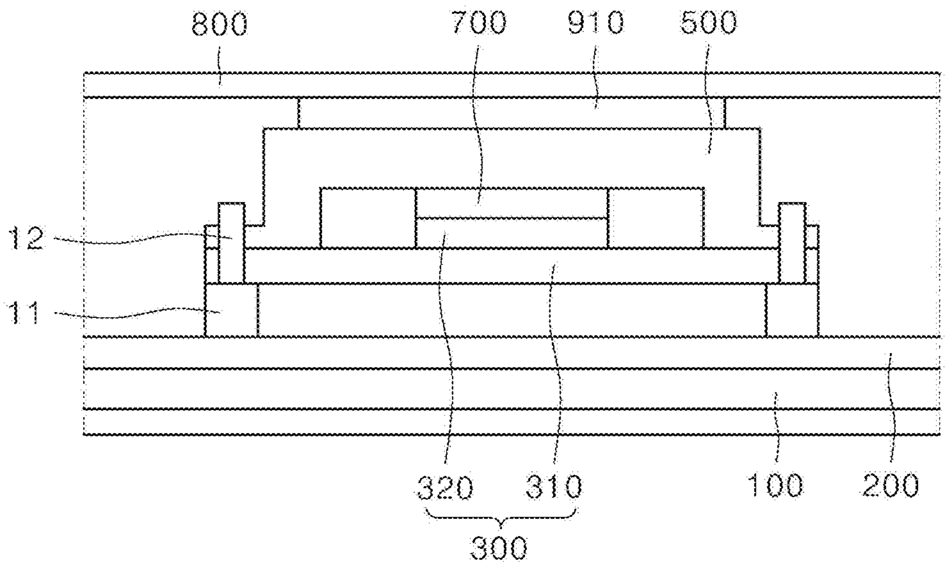
FIG. 1 is a side view showing a general display apparatus.

The above-described objects, features, and advantages will be described below in detail with reference to the accompanying drawings, and thus those skilled in the art to which the present disclosure pertains will be able to easily carry out the technical spirit of the present disclosure. In describing the present disclosure, when it is determined that a detailed description of the known technology related to the present disclosure may unnecessarily obscure the gist of the present disclosure, a detailed description thereof will be omitted. Hereinafter, example embodiments according to the present disclosure will be described in detail with reference to the accompanying drawings. In the drawings, the same reference numerals are used to denote the same or similar components. Further, the term “can” encompasses all the meanings and coverages of the term “may”. Also the term “disclosure” encompasses all the meanings and coverages of the term “invention.”

Although terms such as first and second are used to describe various components, it goes without saying that the components are not limited by these terms. These terms are only used to distinguish one component from another component, and unless otherwise stated, it goes without saying that the first component may be the second component.

Throughout the specification, unless otherwise stated, each component may be singular or plural.

The singular expression used herein includes the plural expression unless the context clearly dictates otherwise. In the application, terms such as “composed of” or “comprising” should not be construed as necessarily including all of the various components or operations described in the specification and should be construed as not including some of the components or some of the operations or further including additional components or operations.

Throughout the specification, when “A and/or B” is described, this means A, B, or A and B unless otherwise specified, and when “C to D” is described, this means C or more and D or less unless otherwise specified.

Figure 3:
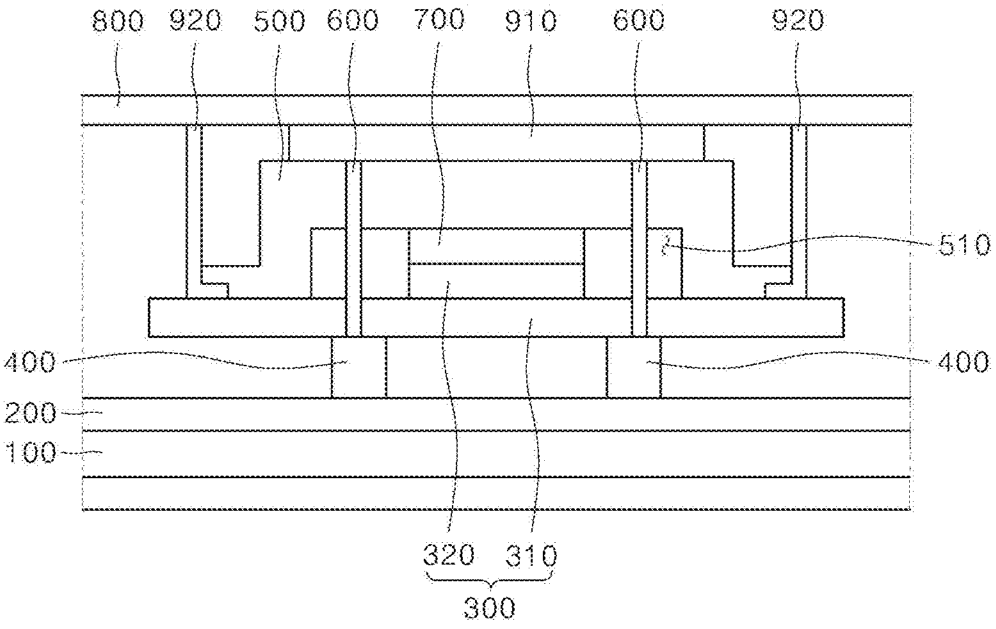
FIG. 3 is a side view showing a display apparatus according to one embodiment of the present disclosure.
Figure 6:
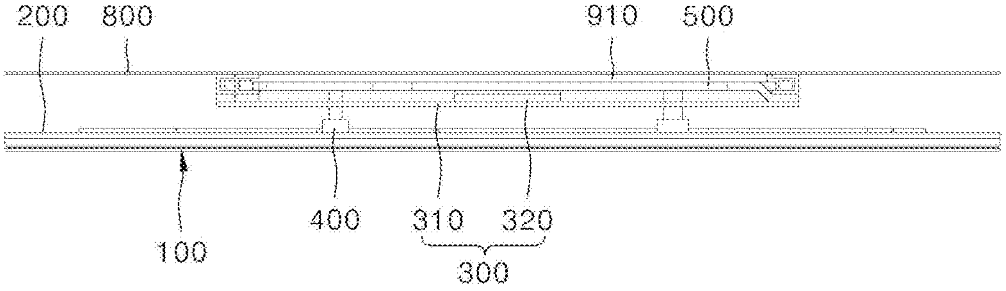
FIG. 6 is a side view of FIG. 5.

Directions referred to as top, bottom, upper side, and lower side in the specification are based on a direction of a display apparatus shown in FIGS. 1, 3, and 6 and may also be referred to as top, bottom, upper side, and lower side in other drawings disposed in the same direction as these drawings.

In an embodiment of the present disclosure, when the display apparatus is mounted in a state of daily use, the lower side in each drawing may be a front surface front of the display apparatus, and the upper side may be a back surface of the display apparatus.

FIG. 1 is a side view showing a general display apparatus.

Referring to FIG. 1, the display apparatus may include a control assembly 300. The control assembly 300 may include a control board 310 and a control chip 320 mounted on an upper surface of the control board 310. The control assembly 300 may control an operation of the display unit 100.

The control board 310 may be provided in a plate shape, and the control chip 320 may be mounted to have a portion protruding from the upper surface of the control board 310. The control chip 320 and the control board 310 may control the operation of the display unit 100 and may be operated by receiving electricity from an external power source to generate heat.

In particular, since the control chip 320 and the control board 310 are provided with relatively large heating elements due to an operation using electricity, the control assembly 300 including the control chip 320 and the control board 310 may generate more heat than the display unit 100.

To dissipate the heat generated from the control chip 320 to the outside of the display apparatus, the display apparatus may be provided with a structure that transfers heat from the control chip 320 to a back cover 800 by conduction.

To smoothly dissipate heat generated from the control chip 320 and the control board 310 to the outside, the control chip 320 may be provided to be in contact with components at an upper side of the display apparatus. Due to such contact, the heat generated from the control assembly 300 may ultimately be transferred to the back cover 800 disposed at the uppermost side of the display apparatus by conduction.

Since the back cover 800 is in contact with the atmosphere, the heat generated from the control assembly 300 may be transferred to the atmosphere through the back cover 800, thereby suppressing overheating of the control assembly 300.

A first pad 700 may be disposed between a portion of the control chip 320 and the shield cover 500 disposed above the control chip 320. The first pad 700 may have a lower surface in contact with an upper surface of the control chip 320 and an upper surface in contact with a lower surface of the shield cover 500.

The first pad 700 may serve as a second pad 910 that transfers heat from the control chip 320 to the shield cover 500 and may be made of a material having high thermal conductivity.

Meanwhile, a first coupler 11 and a second coupler 12 may be disposed at edges of the control board 310 and the shield cover 500. The first coupler 11 may vertically separate the holder 200 and the control board 310 and may be coupled to the holder 200 and/or the control board 310.

The second coupler 12 may be disposed at a location corresponding to the first coupler 11 and may couple the control board 310 with the shield cover 500. A phenomenon that occurs when thermal deformation occurs in the control board 310 in such a structure will be described with reference to FIG. 2.

Figure 2:
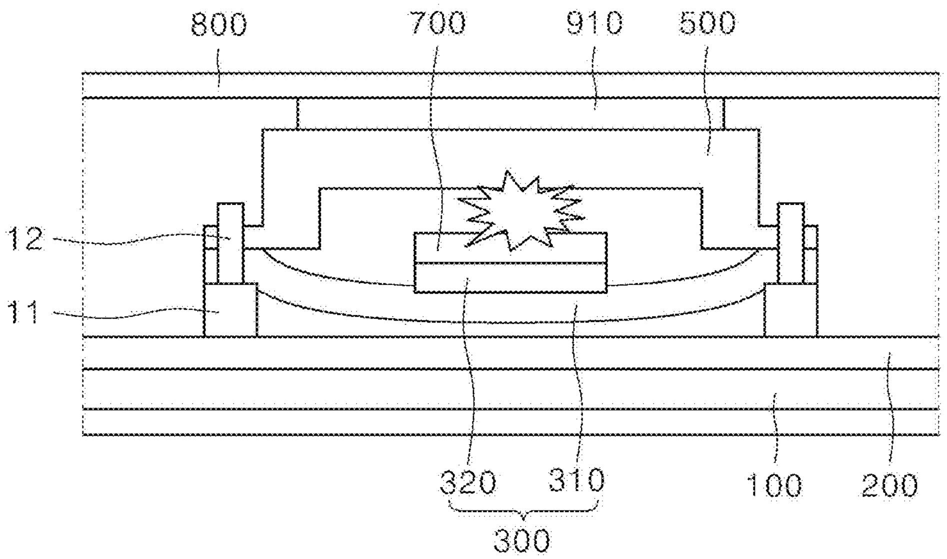
FIG. 2 is a view for describing a limitation of the display apparatus shown in FIG. 1.

FIG. 2 is a view for describing some limitations of the display apparatus shown in FIG. 1.

Referring to FIG. 2, when the display apparatus operates, the entirety of the control assembly 300 including the control board 310 and the control chip 320 may be heated. Due to such heating, thermal expansion of the plate-shaped control board 310 may occur.

Due to thermal expansion, the control board 310 may expand in a lateral direction of the display apparatus. When the control board 310 expands, an original shape of the flat control board 310 may be lost, thereby causing thermal deformation.

In the structure shown in FIG. 1, when thermal deformation occurs in the control board 310 due to thermal expansion, the location and direction in which thermal deformation occurs are as follows.

Since the edges of the control board 310 are constrained by the first coupler 11 and the second coupler 12, even when the control board 310 expands thermally, its location may not be changed or may have a very slight change. Therefore, thermal deformation may occur at a central portion of the control board 310, which is an unconstrained portion.

In addition, the control board 310 and the control chip 320 disposed at the center of the control board 310 are likely to sag due to a reduction in adhesive strength due to high temperature when the control board 310 thermally expands.

Therefore, when the control board 310 thermally expands, there is a very high possibility that thermal deformation in a shape that the central portion of the control board 310 on which the control chip 320 is disposed sags. Therefore, the thermal deformation of the control board 310 due to thermal expansion may have the same tendency as shown in FIG. 2.

When the thermal deformation of the control board 310 continuously occurs due to thermal expansion, the first pad 700 may be separated from the shield cover 500 and/or the control chip 320. That is, due to the thermal deformation of the control board 310, the first pad 700 may be separated from the shield cover 500 and/or the control chip 320 in a state in which upper and lower surfaces are bonded to the shield cover 500 and the control chip 320.

When the adhesive pad 700 is separated from the shield cover 500 and/or the control chip 320, the heat generated from the control assembly 300 may not be smoothly transferred to the back cover 800 by conduction. Therefore, the control assembly 300 may be more heated, and as a result, the operation of the display apparatus may be stopped by overheating, thereby degrading performance in various other ways.

Therefore, there is a need for a structure in which it is possible to suppress the separation of the first pad 700 due to the thermal expansion of the control board 310, and the first pad 700 maintains the contact with the shield cover 500 and the control chip 320 so that the heat transfer from the control assembly 300 to the back cover 800 by conduction may efficiently occur.

The structure according to the present embodiments of the present disclosure for solving or addressing such problems or limitations will be described in detail below with reference to the remaining drawings.

FIG. 3 is a side view showing a display apparatus according to one embodiment of the present disclosure.

Referring to FIG. 3, the display apparatus according to one embodiment may include a display unit 100, a holder 200, a control assembly 300, a separation member 400, a shield cover 500, and a coupling member 600.

The display unit 100 may display an image. The display unit 100 may include a panel in which pixels that display the image are implemented, a cover glass for protecting the panel, a light source for radiating light to the panel, and other components for displaying the image.

The display unit 100 may include a socket 110 generally formed in a plate shape and provided with a cable for electrical connection with the control assembly 300 and/or a power source. The socket 110 may be provided with a protrusion.

The holder 200 may be disposed above the display unit 100 and provided in a plate shape. The holder 200 may cover an upper surface of the display unit 100 to protect internal components of the display unit 100 and at the same time, have an upper surface attached to a support member.

The control assembly 300 may be disposed above the holder 200 and may include a control board 310 and a control chip 320 mounted on an upper surface of the control board 310. The control assembly 300 may control an operation of the display unit 100.

The control board 310 may be provided in a plate shape, and the control chip 320 may be mounted to have a portion protruding from the upper surface of the control board 310. The control chip 320 may include, for example, an integrated circuit and other active and passive elements.

The control board 310 may be provided with various active elements, passive elements, and electric circuits for driving the control chip 320. A controller for controlling the operation of the display unit 100 may be implemented on the control chip 320 and the control board 310.

In this case, the control chip 320 may be provided as, for example, a field programmable gate array (FPGA) chip. The FPGA is a semiconductor element including designable logic elements and programmable internal circuits. However, the present disclosure is not limited thereto.

The control chip 320 and the control board 310 may control the operation of the display unit 100 and may be operated by receiving electricity from an external power source to generate heat. In particular, since the control chip 320 and the control board 310 are provided with relatively large heating elements due to an operation using electricity, the control assembly 300 including the control chip 320 and the control board 310 may generate more heat than the display unit 100.

To dissipate the heat generated from the control chip 320 to the outside of the display apparatus, the display apparatus may be provided with a structure that transfers heat from the control chip 320 to a back cover 800 by conduction. This will be described in detail below.

The separation member 400 may be disposed between the holder 200 and the control assembly 300 to vertically separate the control assembly 300 and the holder 200. The separation member 400 may be disposed between the holder 200 and the control assembly 300 to prevent the control assembly 300 from being in contact with the holder 200.

The heat generated from the control assembly 300 may be transferred downward, that is, toward the display unit 100. The heat generated from the control assembly 300 may be transferred to the display unit 100 provided thereunder through the holder 200.

When the heat generated from the control assembly 300 is transferred to the display unit 100, the display unit 100 may overheat, thereby degrading operating performance. Meanwhile, heat transfer by conduction accounts for the largest proportion compared to convection or radiation.

Therefore, it is necessary to suppress the overheating of the display unit 100 by suppressing the heat transfer from the control assembly 300 to the display unit 100 by conduction, and to this end, the control board 310 of the control assembly 300 and the holder 200 need to be spaced apart from each other in a vertical direction. A component that plays such a role is the separation member 400.

The separation member 400 may be disposed between the holder 200 and the control board 310 to separate the holder 200 and the control board 310, thereby effectively suppressing the heat transfer by conduction due to contact between the holder 200 and the control board 310.

The shield cover 500 may be disposed to cover the control chip 320 above the control assembly 300. The shield cover 500 may be formed with an accommodation part 510 for accommodating the control chip 320 and the first pad 700 attached to the upper surface of the control chip 320.

The shield cover 500 may be provided in a plate shape having a substantially groove-shaped accommodation part 510 and may protect the control assembly 300 by covering the upper surface of the control assembly 300. In particular, the shield cover 500 may cover the control chip 320 disposed on the upper surface of the control board 310 to block external electromagnetic waves from flowing into the control chip 320, thereby effectively suppressing the defective operation of the control chip 320 due to the electromagnetic waves.

Likewise, the shield cover 500 may cover at least a portion of the upper surface of the control board 310 to protect the entirety of the control assembly 300 from electromagnetic waves, thereby effectively suppressing the defective operation of the control assembly 300 due to the electromagnetic waves.

The shield cover 500 can effectively block the electromagnetic waves and at the same time, may be made of a material having high thermal conductivity. Therefore, the shield cover 500 may be made of a metal material, such as aluminum or a material containing aluminum, or magnesium or a material containing magnesium.

The coupling member 600 may be coupled to the control board 310 and the separation member 400. The coupling member 600 may couple the control board 310 with the shield cover 500.

The separation member 400 and the coupling member 600 may be disposed at locations corresponding to each other. In addition, the number of separation members 400 is the same as the number of coupling members 600. The coupling member 600 may have one side coupled to the shield cover 500 and the other side coupled to the separation member 400 and may be disposed to pass through the control board 310.

Meanwhile, the separation member 400 may be attached to an upper surface of the holder 200. Therefore, the control board 310 may be fixedly disposed at a predetermined location above the holder 200.

Further, a frame coupled to edges of the display apparatus may be provided as needed. The frame may be coupled to the display apparatus to close side surfaces of the display apparatus.

The display apparatus may include the first pad 700, the back cover 800, and the second pad 910.

The first pad 700 may be disposed between the control chip 320 and the shield cover 500 and may be in contact with each of the control chip 320 and the shield cover 500.

Meanwhile, the shield cover 500 may include the accommodation part 510 formed by recessing a portion of the shield cover 500 to accommodate the control chip 320 and the first pad 700. The accommodation part 510 may be formed as a groove that is convex upward from the shield cover 500.

In a state in which the first pad 700 is accommodated in the accommodation part 510, the first pad 700 may be disposed between the control chip 320 and the shield cover 500 to couple the control chip 320 with the shield cover 500. The first pad 700 may be made of an adhesive material having high thermal conductivity to smoothly transfer heat between the shield cover 500 and the control chip 320.

The back cover 800 may be disposed above the shield cover 500 and may be in contact with the second pad 910. The back cover 800 may be provided in a plate shape to have an area corresponding to the display unit 100 and formed to have a greater area than the second pad 910.

The back cover 800 can protect the display apparatus and simultaneously dissipate heat transferred from the second pad 910 into the atmosphere. Therefore, the back cover 800 may be made of a metal material having high thermal conductivity, such as aluminum, copper, or a material containing aluminum or copper.

The second pad 910 may be provided in a plate shape, disposed above the shield cover 500, and may be in contact with a portion of the shield cover 500. The second pad 910 may be formed to have a smaller area than the shield cover 500.

The second pad 910 may be disposed between the shield cover 500 and the back cover 800 and may be in contact with each of the shield cover 500 and the back cover 800. The second pad 910 may serve to transfer the heat from the shield cover 500 to the back cover 800. Therefore, the second pad 910 is appropriately made of a material having high thermal conductivity.

The first pad 700 and the second pad 910 may be made of, for example, thermal interface materials (TIM) that have high thermal conductivity and are highly effective in dissipating heat from chips in electronic and electrical products. However, the present disclose is not limited thereto.

With the above-described structure, the heat generated from the control assembly 300 may be sequentially transferred to the control chip 320, the first pad 700, the shield cover 500, the heat transfer member 910, and the back cover 800 and finally discharged to the atmosphere through the back cover 800, thereby suppressing the overheating of the display apparatus.

As shown in FIG. 3, in the display apparatus according to the embodiment, the separation member 400 and the coupling member 600 may be disposed at locations spaced apart from the edges of the control board 310. Specifically, the separation member 400 and the coupling member 600 may be disposed at locations spaced by a set distance inward from end portions of side surfaces of the control board 310.

In addition, a plurality of separation members 400 and coupling members 600 may be provided, and the separation member 400 and the coupling member 600 may be symmetrically disposed with respect to the control chip 320.

Therefore, the central portion of the control board 310 may be disposed inside the plurality of separation members 400 and coupling members 600, and the edges of the control board 310 may be disposed outside the plurality of separation members 400 and the coupling members 600.

With this structure, compared to the structure shown in FIG. 1, the display apparatus of the present disclosure may have the separation member 400 and the coupling member 600 disposed inside the control board 310 away from the edges of the control board 310.

Therefore, since the central portion of the control board 310 becoming the inside of the separation member 400 and the coupling member 600 may be constrained by the separation member 400 and the coupling member 600, the movement of the control board 310 may be absent or extremely limited when thermally expanding.

On the other hand, the edges of the control board 310 becoming the outside of the separation member 400 and the coupling member 600 may be free from the separation member 400 and the coupling member 600, and thus freely deformed when the control board 310 thermally expands. Meanwhile, when the control board 310 thermally expands, there is a possibility that the control board 310 may be thermally deformed downward from the edges thereof.

As such, when the control assembly 300 is heated, the control board 310 thermally expands laterally, and the central portion thereof is constrained by the separation member 400 and the coupling member 600, and thus its movement is extremely restricted. Therefore, no great deformation occurs, and there is a possibility that the edges may be thermally deformed downward.

Figure 4:
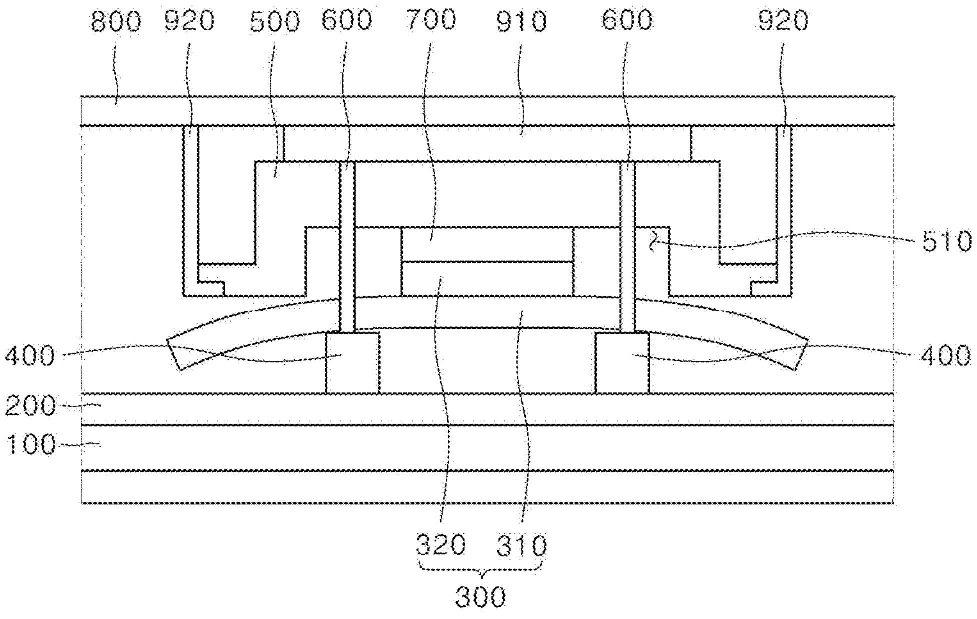
FIG. 4 is a view showing a state in which thermal deformation occurs in a control board in the display apparatus shown in FIG. 3.

The thermal deformation of the control board 310 due to the tendency of heat is shown in FIG. 4. FIG. 4 is a view showing a state in which thermal deformation occurs in the control board 310 in the display apparatus shown in FIG. 3.

In an embodiment of the present disclosure, referring to FIG. 4, when the control board 310 is expanded and deformed by heating, the control board 310 may be provided to move down from the edge portions whose movement is not restricted by the separation member 400 and the coupling member 600.

With this structure, thermal deformation may occur at the edges of the control board 310 due to the thermal expansion of the control board 310. In addition, thermal deformation may not occur at the central portion of the control board 310 in which the control chip 320 is disposed.

As a result, even when the control assembly 300 is heated, the control chip 320 disposed at the central portion of the control board 310 can maintain its location, and thus the first pad 700 may be compressed to improve heat transfer and may not be separated from the control chip 320 and/or the shield cover 500.

Even when the control board 310 is thermally expanded, the first pad 700 maintains the contact state with the control chip 320 and the shield cover 500, and thus the heat generated from the control assembly 300 can be effectively dissipated through the back cover 800 disposed at the uppermost portion thereof by heat conduction through the first pad 700 and components in contact with the first pad 700.

With this structure, it is possible to improve the heat dissipation of the display apparatus and effectively suppress the overheating of the control assembly 300.

When the control assembly 300 is heated, the heat may be transferred to the shield cover 500, and the shield cover 500 may be thermally expanded and deformed by heating. When the shield cover 500 is deformed, the second pad 910 attached to an upper surface of the shield cover 500 may be separated from the shield cover 500 and/or the back cover 800.

Due to such separation, the heat conduction efficiency from the control assembly 300 to the back cover 800 can be greatly reduced. Therefore, there is a need for a structure in which the second pad 910 is in contact with the shield cover 500 and the back cover 800 even when the shield cover 500 is heated. According to such a need, a holding part may be provided in the embodiment.

The display apparatus may include a holding member 920 having one side coupled to the shield cover 500 and the other side coupled to the back cover 800 to pull the shield cover 500 and the back cover 800 so that the second pad 910 maintains the contact state with the shield cover 500 and the back cover 800.

A plurality of holding members 920 each disposed at edges of the shield cover 500 may be provided. Since the plurality of holding members 920 are provided as described above, the holding member 920 may evenly pull the entirety of the shield cover 500.

As the holding member 920 pulls the shield cover 500 and the back cover 800, the second pad 910 may maintain the contact with the shield cover 500 and the back cover 800 without being separated by a tensile force of the holding member 920 even when the shield cover 500 is heated and its shape is deformed.

Therefore, it is possible to increase the heat dissipation efficiency of the display apparatus according to the present disclosure and prevent the overheating of the control assembly 300, thereby improving the performance of the display apparatus.

A coefficient of thermal expansion of the holding member 920 may be provided to be smaller than that of the shield cover 500. With this structure, even when the shield cover 500 is deformed due to thermal expansion, the holding member 920 having a relatively small coefficient of thermal expansion may be slightly deformed, thereby effectively suppressing the separation of the second pad 910 to allow the first pad 700 to maintain the contact with the shield cover 500 and the back cover 800.

For example, the shield cover 500 may be made of aluminum or a metal material containing aluminum. The holding member 920 may be made of electro galvanized iron (EGI) material having a smaller coefficient of thermal expansion than aluminum and excellent corrosion resistance.

Figure 5:
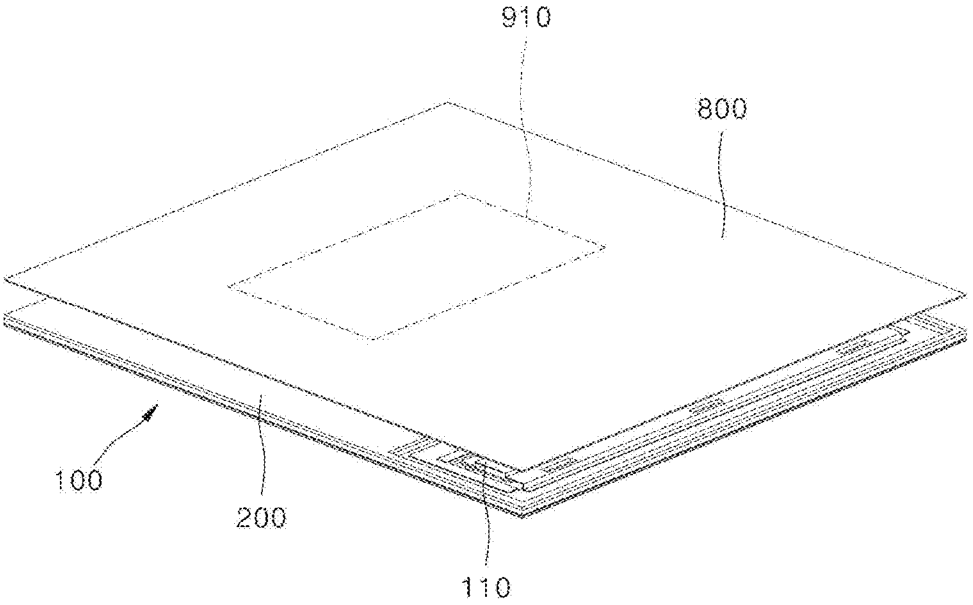
FIG. 5 is a perspective view showing a display apparatus according to another embodiment of the present disclosure.

FIG. 5 is a perspective view showing a display apparatus according to another embodiment of the present disclosure.

Figure 7:
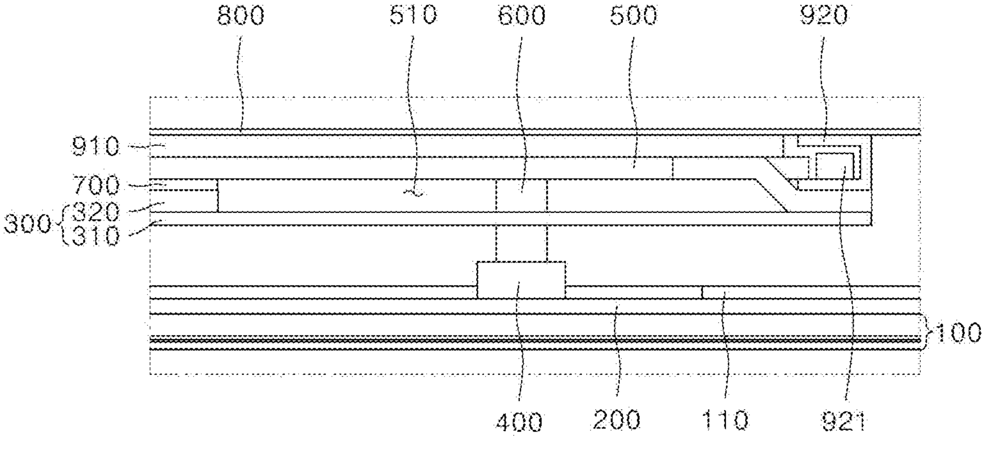
FIG. 7 is an enlarged view of a portion of FIG. 6.
Figure 8:
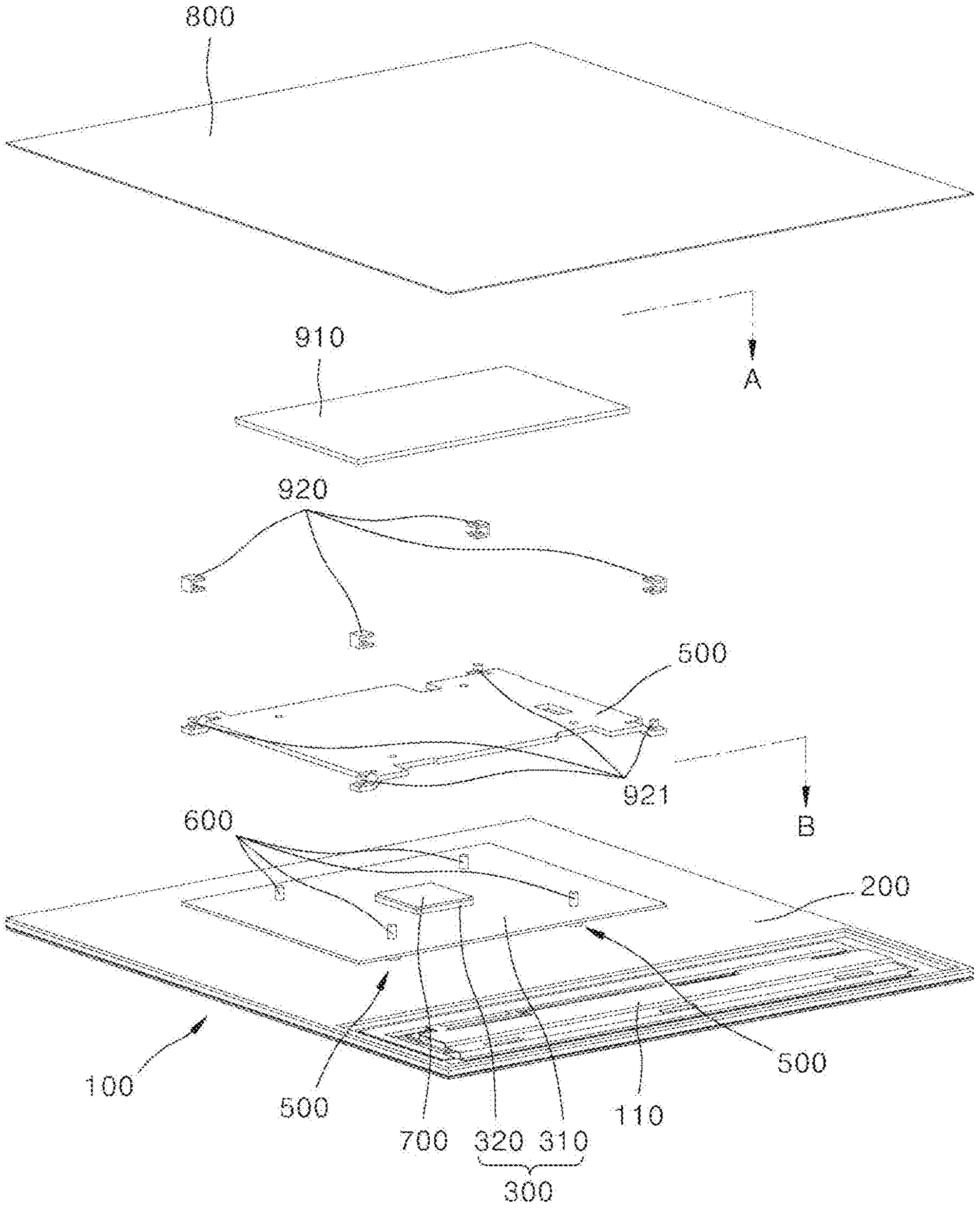
FIG. 8 is an exploded view of FIG. 5.

FIG. 6 is a side view of FIG. 5. FIG. 7 is an enlarged view of a portion of FIG. 6. FIG. 8 is an exploded view of FIG. 5. Hereinafter, descriptions overlapping the above-described contents may be omitted or may be briefly discussed.

Referring to FIGS. 5 to 8, the coupling member 600 may be provided to pass through the control board 310. In this case, the control board 310 needs to be provided so as not to move with respect to the coupling member 600. That is, the coupling member 600 may be firmly coupled to the control board 310 at a portion passing through the control board 310 to prevent the control board 310 from moving with respect to the coupling member 600.

With this structure, even when the control board 310 is thermally deformed due to thermal expansion, the control board 310 may be constrained by the coupling portion to prevent the central portion of the control board 310 from being thermally deformed, and thus it is possible to effectively suppress the separation of the first pad 700 by heating.

For example, the coupling member 600 and the control board 310 may be attached by an adhesive at a portion in which the coupling member 600 passes through the control board 310 so that the coupling member 600 and the control board 310 may be coupled firmly.

In another embodiment, a male thread may be formed on the coupling member 600, and a female thread may be formed on a passing-through portion of the control board 310 to couple the coupling member 600 with the control board 310 using a screw, and thus the coupling member and the control board 310 may be coupled firmly.

The holding member 920 may be formed in a U shape and may have an upper surface attached to the back cover 800 and a lower surface coupled to the shield cover 500. The shield cover 500 may be provided with a coupling pin 921 to be coupled to the holding member 920. The coupling pin 921 may be formed integrally with the shield cover 500 or attached to the upper surface of the shield cover 500 using a method such as welding.

A lower portion of the holding member 920 may be mounted on the coupling pin 921. A hole through which the coupling pin 921 passes may be formed in the holding member 920, and the holding member 920 may be attached to the coupling pin 921 by an adhesive, or the male thread may be formed on the holding member 920 and the female thread may be formed in the hole of the coupling pin 921, thereby enabling screw coupling. Alternatively, the holding member 920 may be coupled to the coupling pin 921 by welding.

In an embodiment, when the control board 310 is thermally expanded, the coupling member 600 can suppress the separation of the first pad 700, and the holding member 920 can prevent the separation of the second pad 910.

That is, the coupling member 600 may pull the control board 310 and the shield cover 500 so that the first pad 700 maintains the contact with each of the control chip 320 and the shield cover 500. In addition, the holding member 920 may pull the shield cover 500 and the back cover 800 so that the second pad 910 maintains the contact with each of the shield cover 500 and the back cover 800.

Figure 9:
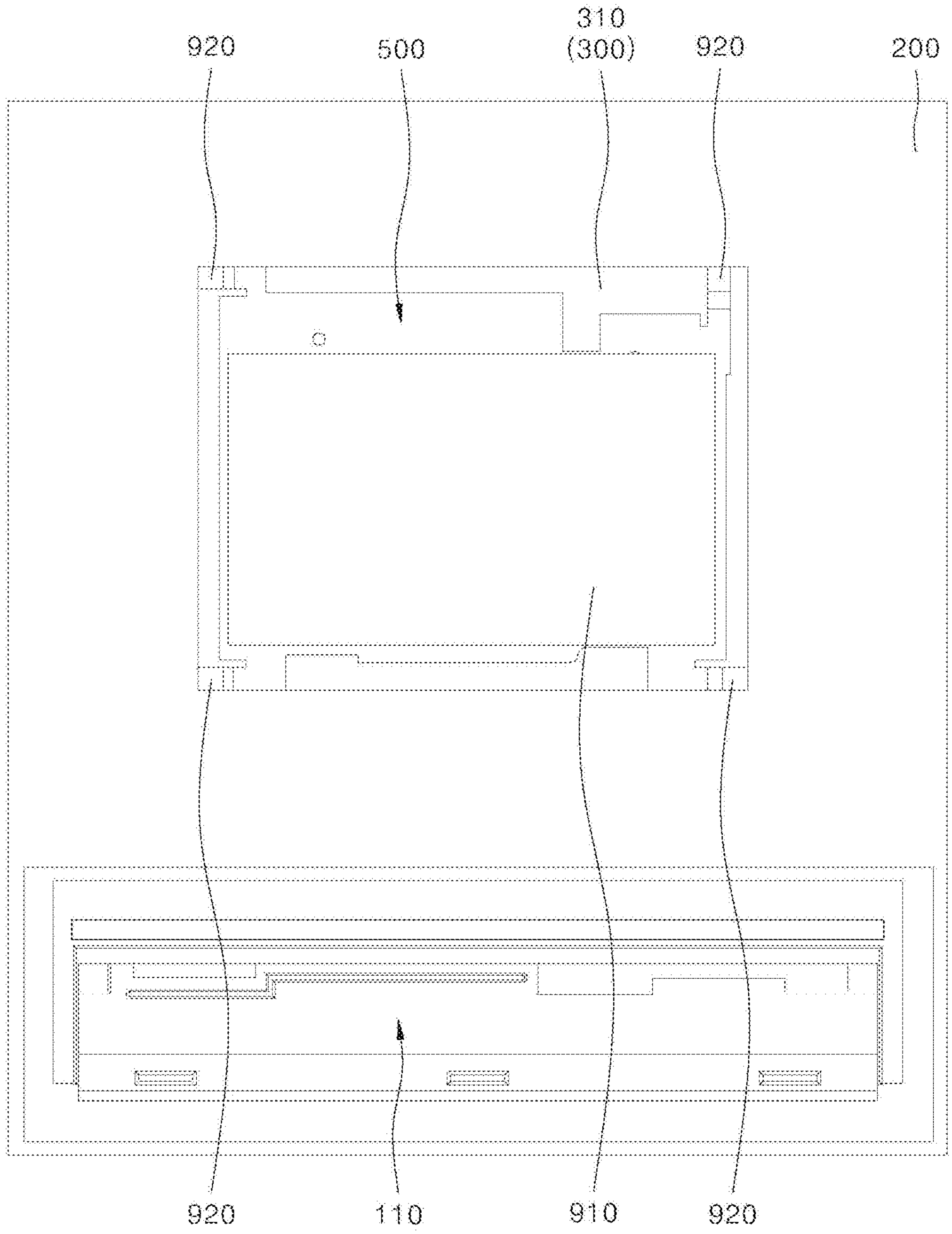
FIG. 9 is a plan view showing where some components of the display apparatus viewing at location A of FIG. 8 have been omitted for the sake of clarity.

FIG. 9 is a plan view showing that some components of the display apparatus viewing at location A of FIG. 8 have been omitted for the sake of clarity.

In an embodiment of the present disclosure, referring to FIG. 9, the control board 310 may be provided as a quadrangular plate, and a plurality of holding members 920 each disposed at a corner of the control board 310 may be provided. The plurality of holding members 920 may be disposed to be spaced apart from each other to surround the second pad 910.

With this structure, the holding member 920 may evenly pull the entirety of the control board 310. Therefore, the entirety of the second pad 910 may uniformly maintain the contact with the shield cover 500 and the back cover 800 by receiving a uniform pressing force.

Figure 10:
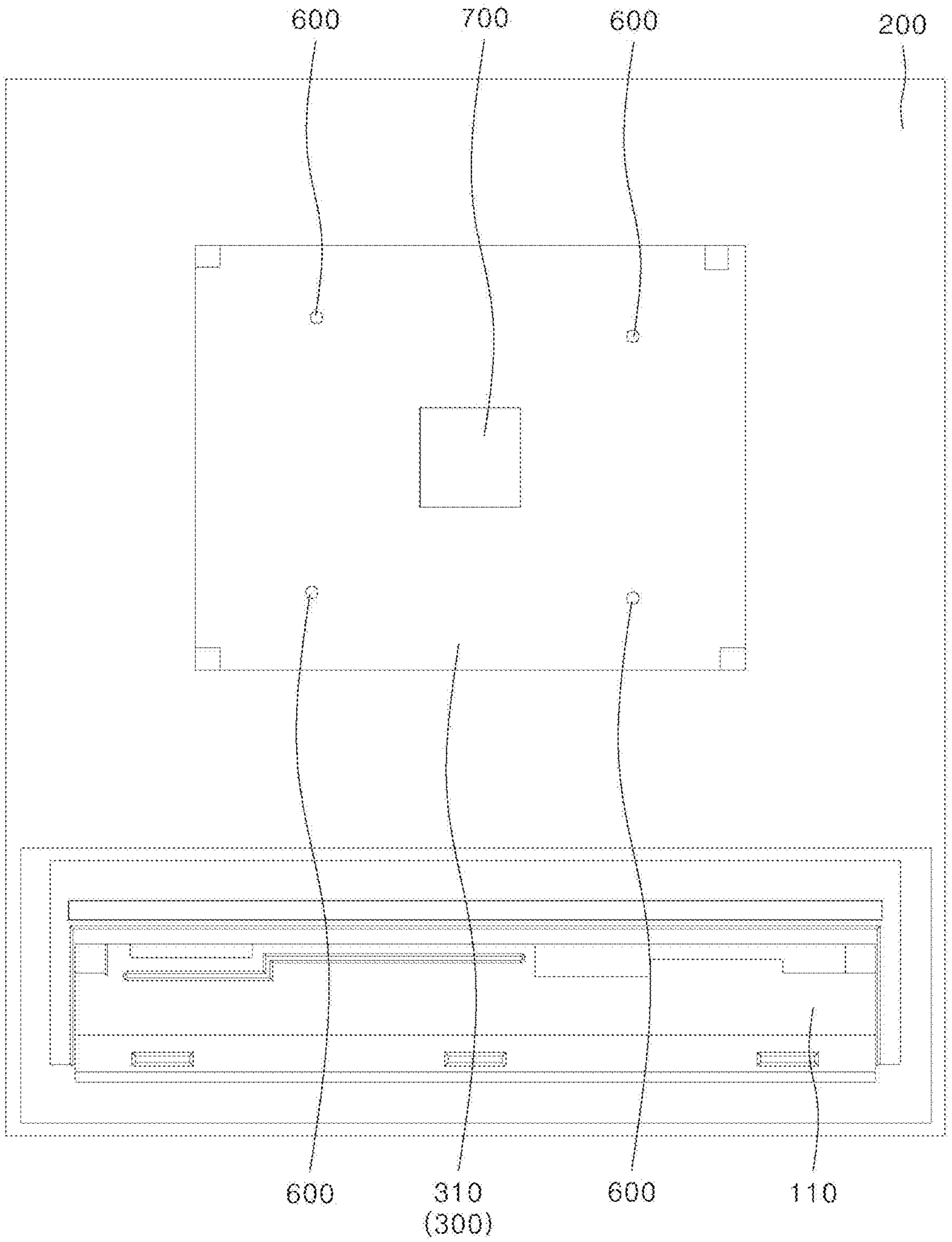
FIG. 10 is a plan view showing where some components of the display apparatus viewing at location B of FIG. 8 have been omitted for the sake of clarity.

FIG. 10 is a plan view showing that some components of the display apparatus viewing at location B of FIG. 8 have been omitted for the sake of clarity.

Referring to FIG. 10, a plurality of separation members 400 and coupling members 600 may be provided, and the separation member 400 and the coupling member 600 may be disposed to be spaced apart each to surround the first pad 700.

With this structure, the separation member 400 and the coupling member 600 may maintain the locations of the central portion of the control board 310, and even when the control board 310 is thermally expanded and deformed, it is possible to prevent the thermal deformation at the central portion of the control board 310.

A display apparatus according to one embodiment of the present disclosure may include a display unit for displaying an image, a holder disposed above the display unit and provided in a plate shape, a control assembly disposed above the holder and including a control board and a control chip mounted on an upper surface of the control board, a separation member disposed between the holder and the control assembly to vertically separate the control assembly and the holder, a shield cover disposed to cover the control chip above the control assembly, and a coupling member for coupling the control board with the separation member, in which the separation member and the coupling member may be disposed at locations spaced apart from edges of the control board.

The separation member and the coupling member may be disposed at locations spaced by a set distance inward from end portions of side surfaces of the control board.

When the control board is expanded and deformed by heating, the control board may be provided to move down from the edge portions whose movement is not restricted by the separation member and the coupling member.

The separation member and the coupling member may be disposed at locations corresponding to each other.

A plurality of separation members and coupling members may be provided, and the separation member and the coupling member may be disposed symmetrically with respect to the control chip.

The coupling member may have one side coupled to the shield cover and the other side coupled to the separation member and may be disposed to pass through the control board.

The coupling member may be firmly coupled to the control board at a portion passing through the control board to prevent the control board from moving with respect to the coupling member.

A display apparatus according to one embodiment of the present disclosure may include a first pad disposed between the control chip and the shield cover and in contact with each of the control chip and the shield cover, a back cover disposed above the shield cover, and a second pad disposed between the shield cover and the back cover and in contact with each of the shield cover and the back cover.

The shield cover may include an accommodation part formed by recessing a portion of the shield cover to accommodate the control chip and the first pad.

A display apparatus according to one embodiment of the present disclosure may include a holding member having one side coupled to the shield cover and the other side coupled to the back cover to pull the shield cover and the back cover so that the second pad maintains contact between the shield cover and the back cover.

The control board may be provided as a quadrangular plate, and a plurality of holding members each disposed at a corner of the control board may be provided.

The plurality of holding members may be disposed to be spaced apart from each other to surround the second pad.

The coupling member may pull the control board and the shield cover so that the first pad maintains contact between the control chip and the shield cover, and the holding member may pull the shield cover and the back cover so that the second pad maintains the contact with each of the shield cover and the back cover.

A plurality of separation members and coupling members may be provided, and the separation member and the coupling member may be disposed to be spaced apart from each other to surround the first pad.

In the display apparatus according to various aspects of the present disclosure, when the control board is expanded and deformed by heating, the control board may be provided to move down from the edge portions whose movement is not restricted by the separation member and the coupling member. With this structure, thermal deformation may occur at the edges of the control board due to thermal expansion of the control board. In addition, thermal deformation may not occur at a central portion of the control board on which the control chip is disposed.

As a result, even when the control assembly is heated, the control chip disposed at the central portion of the control board can maintain its location, and thus the first pad may be compressed to improve heat transfer and prevent the separation from the control chip and/or the shield cover. Even when the control board is thermally expanded, the first pad is in a state in which the control chip is in contact with the shield cover, and thus the heat generated from the control assembly can be effectively dissipated through the back cover disposed at the outermost portion thereof by heat conduction through the first pad and the component in contact the first pad.

With this structure, it is possible to improve the heat dissipation of the display apparatus and effectively suppress the overheating of the control assembly.

In addition, in the display apparatus according to various aspects of the present disclosure, since the holding member pulls the shield cover and the back cover, even when the shield cover is heated and its shape is deformed, the second pad is not separated due to the tensile force of the holding member and can maintain the contact with the shield cover and the back cover.

Therefore, it is possible to increase the heat dissipation efficiency of the display apparatus and prevent the overheating of the control assembly, thereby improving the performance of the display apparatus.

Specific effects together with the above-described effects are described together with a description of the following detailed matters for carrying out the disclosure.

Although the present disclosure has been described above with reference to example drawings, the present disclosure is not limited by the embodiments and drawings disclosed in the specification, and it is apparent that various modifications can be made by those skilled in the art within the scope of the technical spirit of the present disclosure. In addition, even when the operational effects according to the configuration of the present disclosure have not been explicitly described in the description of the embodiments of the present disclosure, it goes without saying that the effects predictable by the corresponding configuration should be recognized.

What is claimed is:

1. A display apparatus comprising:
- a display unit configured to display an image;
- a holder disposed on the display unit and having a plate shape;
- a control assembly disposed on the holder, and including a control board and a control chip mounted on an upper surface of the control board;
- a plurality of separation members disposed between the holder and the control assembly, and configured to vertically separate the control assembly and the holder;
- a shield cover covering the control chip on the control assembly; and
- a plurality of coupling members configured to couple the control board with the plurality of separation members,
- wherein the plurality of separation members and the plurality of coupling members are spaced apart from edges of the control board, and
- wherein, when the control board is expanded and deformed by heating, the control board is provided to move down from edge portions whose movement is not restricted by the plurality of separation members and the plurality of coupling members.

2. The display apparatus of claim 1, wherein the plurality of separation members and the plurality of coupling members are spaced by a set distance inward from end portions of side surfaces of the control board.

3. The display apparatus of claim 2, wherein the plurality of separation members and the plurality of coupling members are configured to correspond to each other.

4. The display apparatus of claim 2, wherein the plurality of separation members and the plurality of coupling members are disposed symmetrically with respect to the control chip.

5. The display apparatus of claim 2, wherein the plurality of coupling members includes one side coupled to the shield cover and another side coupled to the plurality of separation members, and are disposed to pass through the control board.

6. The display apparatus of claim 5, wherein the plurality of coupling members are firmly coupled to the control board at a portion passing through the control board to prevent the control board from moving with respect to the plurality of coupling members.

7. The display apparatus of claim 1, further comprising:
- a first pad disposed between the control chip and the shield cover and in contact with each of the control chip and the shield cover;
- a back cover disposed on the shield cover; and
- a second pad disposed between the shield cover and the back cover and in contact with each of the shield cover and the back cover.

8. The display apparatus of claim 7, wherein the shield cover includes an accommodation part formed by recessing a portion of the shield cover to accommodate the control chip and the first pad.

9. The display apparatus of claim 7, further comprising:
- a plurality of holding members having one side coupled to the shield cover and another side coupled to the back cover to pull the shield cover and the back cover, so that the second pad maintains contact between the shield cover and the back cover.

10. The display apparatus of claim 9, wherein the control board is provided as a quadrangular plate, and each of the plurality of holding members is disposed at a corner of the control board.

11. The display apparatus of claim 10, wherein the plurality of holding members are spaced apart from each other to surround the second pad.

12. The display apparatus of claim 9, wherein the plurality of coupling members pull the control board and the shield cover, so that the first pad maintains contact between the control chip and the shield cover, and the plurality of holding members pull the shield cover and the back cover, so that the second pad maintains the contact with each of the shield cover and the back cover.

13. The display apparatus of claim 7, wherein the plurality of separation members and the plurality of coupling members are spaced apart from each other to surround the first pad.

* * * * *